(12) United States Patent
Kim et al.

(10) Patent No.: US 11,639,140 B2
(45) Date of Patent: May 2, 2023

(54) METHOD FOR MANUFACTURING REAL ALUMINUM USING ALUMINUM ALLOY CAPABLE OF BEING APPLIED TO COIL-TO-UNCOIL PROCESS, AND VEHICLE INTERIOR PART

(71) Applicants: HYUNDAI MOTOR COMPANY, Seoul (KR); Kia Motors Corporation, Seoul (KR)

(72) Inventors: Ye-Lim Kim, Anyang-si (KR); Chang-Yeol Yoo, Suwon-si (KR); Hyung-Sop Yoon, Yongin-si (KR)

(73) Assignees: Hyundai Motor Company, Seoul (KR); Kia Motors Corporation, Seoul (KR)

( * ) Notice: Subject to any disclaimer, the term of this patent is extended or adjusted under 35 U.S.C. 154(b) by 651 days.

(21) Appl. No.: 16/693,905

(22) Filed: Nov. 25, 2019

(65) Prior Publication Data
US 2020/0207285 A1    Jul. 2, 2020

(30) Foreign Application Priority Data

Dec. 26, 2018    (KR) .......................... 10-2018-0169446

(51) Int. Cl.
| | |
|---|---|
| *B60R 13/02* | (2006.01) |
| *C22C 21/14* | (2006.01) |
| *C22C 21/02* | (2006.01) |
| *C22F 1/057* | (2006.01) |
| *B21B 1/22* | (2006.01) |
| *B05D 1/02* | (2006.01) |

(Continued)

(52) U.S. Cl.
CPC ............ *B60R 13/0243* (2013.01); *B05D 1/02* (2013.01); *B05D 3/12* (2013.01); *B05D 7/14* (2013.01); *B21B 1/227* (2013.01); *C22C 21/02* (2013.01); *C22C 21/14* (2013.01); *C22F 1/043* (2013.01); *C22F 1/057* (2013.01); *C23C 14/0635* (2013.01); *B05D 2202/25* (2013.01); *B05D 2350/60* (2013.01)

(58) Field of Classification Search
CPC ... B05D 1/02; B05D 3/12; B05D 7/14; B05D 2202/25; B05D 2350/60; B21B 1/227; B60R 13/0243; C22C 21/02; C22C 21/13; C22F 1/043; C22F 1/057; C23C 14/0635
See application file for complete search history.

(56) References Cited

U.S. PATENT DOCUMENTS

| | | | | |
|---|---|---|---|---|
| 5,865,931 | A * | 2/1999 | Serafin ................... | B32B 15/08 148/265 |
| 2004/0061019 | A1* | 4/2004 | Hobbis ................... | B21C 47/28 242/410 |
| 2018/0272684 | A1* | 9/2018 | Sánchez Martínez .... | B21B 1/38 |

FOREIGN PATENT DOCUMENTS

| | | | | |
|---|---|---|---|---|
| GB | 1273261 | A * | 5/1972 | ............ C22C 21/12 |
| JP | 2528187 | B2 | 8/1996 | |

(Continued)

*Primary Examiner* — James C Goloboy
(74) *Attorney, Agent, or Firm* — Fox Rothschild LLP

(57) ABSTRACT

A method for manufacturing an aluminum alloy sheet may include melting aluminum alloy composition containing silicon (Si), iron (Fe), copper (Cu) and manganese (Mn) in weight % on the basis of remainder of aluminum (Al) to make cast alloy having a constant initial thickness; rolling the cast alloy to allow the initial thickness to be reduced, whereby the cast alloy is elongated to aluminum alloy sheet; and performing heat treatment on the aluminum alloy sheet.

10 Claims, 15 Drawing Sheets

(51) Int. Cl.
 B05D 7/14 (2006.01)
 C23C 14/06 (2006.01)
 C22F 1/043 (2006.01)
 B05D 3/12 (2006.01)

(56) References Cited

FOREIGN PATENT DOCUMENTS

| | | | | |
|---|---|---|---|---|
| JP | 2004291445 A | * | 10/2004 | |
| JP | 2012-121608 A | | 6/2012 | |
| JP | 5623167 B2 | | 11/2014 | |
| KR | 20170012840 A | * | 2/2017 | ............. C23C 28/30 |

* cited by examiner

ME THOD FOR MANUFACTURING REAL ALUMINUM USING ALUMINUM ALLOY CAPABLE OF BEING APPLIED TO COIL-TO-UNCOIL PROCESS, AND VEHICLE INTERIOR PART

CROSS-REFERENCE TO RELATED APPLICATION

This application claims priority to Korean Patent Application No. 10-2018-0169446, filed on Dec. 26, 2018, which is incorporated herein by reference in its entirety.

BACKGROUND OF THE DISCLOSURE

Field of the Disclosure

The present disclosure relates to a method for manufacturing a real aluminum, and more particularly, to a vehicle interior part to which the real aluminum is applied.

Description of Related Art

In general, in addition to formability and mechanical properties, an aluminum sheet enables enhancement of aesthetic appearance and luxury such as surface texture or surface finishes. Therefore, even in a vehicle field, the aluminum sheet is applied to an interior part for upgrading of aesthetic appearance in addition to appearance protection.

One example of the interior part is a door trim real aluminum garnish that is made with an aluminum sheet material that is referred as "real aluminum" in the present disclosure. The real aluminum that is used for making the door trim real aluminum garnish is manufactured by forming and machining an aluminum sheet to realize a pattern and a color on a metal surface.

However, the aluminum sheet having both formability and mechanical properties should be applied to the real aluminum, which makes it difficult to commercialize the real aluminum due to a shortage of supply in comparison with the demand. Particularly, the aluminum sheet suitable for the real aluminum should be capable of achieving higher level of thin thickness and formability, so that shortage of the amount of supply of the aluminum sheet having such properties has been further exacerbated.

The contents described in Description of Related Art are to help the understanding of the background of the present disclosure, and may include what is not previously known to those skilled in the art to which the present disclosure pertains.

SUMMARY OF THE DISCLOSURE

One aspect of the present disclosure provides a method for manufacturing a real aluminum using an aluminum alloy which can be applied to a coil-to-uncoil process, in which an aluminum alloy has physical properties such as a thin thickness, formability and a strength, which are suitable for manufacturing of a real aluminum to enable the real aluminum to be stably supplied according to the demand, and in particular, after manufacturing the real aluminum using an aluminum coil of the aluminum alloy, the real aluminum is cut into a size of sheet, so that high yield and cost reduction are achieved by a batch of processes, and a vehicle interior part.

The term "real aluminum" as used in the present disclosure refers to a products of aluminum metal that possesses patterns and colors on the surface of aluminum for decoration.

The term "coil-to-uncoil process" as used the present disclosure refers to process of forming a real aluminum using roller. For instance, during the coil-to-uncoil process, a coil of an aluminum coil is uncoiled, the uncoiled sheet is subjected to surface treatment (e.g., patterning and coloring) on the surface of thereof, and the processed sheet is recoiled.

The term "cast alloy" as used the present disclosure refer to aluminum alloy by rolling and before step of heat-treating the aluminum alloy sheet.

Another aspect of the invention provides a method for manufacturing an aluminum alloy sheet may include preparing aluminum alloy composition containing silicon (Si) of 0.5 wt % or less, iron (Fe) of 1.7 to 2.0 wt %, copper (Cu) of 0.5 wt % or less, manganese (Mn) of 2.0 to 6.0 wt %, and remainder of aluminum (Al) and inevitable impurities, melting the aluminum alloy composition to make cast alloy, making an aluminum alloy sheet having a constant thickness by rolling the cast alloy, and heat-treating the aluminum alloy sheet.

In heat-treating the aluminum alloy sheet, the aluminum alloy sheet may be heat-treated at a temperature of 300 to 350° C. for 20 to 30 minutes.

In making the aluminum alloy sheet, the aluminum alloy sheet may be rolled and formed to have a thickness 0.4 to 0.8 mm.

A further aspect of the invention provides a method for manufacturing of an aluminum alloy sheet product using a coil-to-uncoil process according to the present disclosure may be characterized in that as an aluminum coil is drawn out, an aluminum coil is sequentially transformed into a patterned coil having a pattern formed thereon by a rolling mill, a colored coil on which a first coating is performed by a vacuum coater, and a surfacing coil on which a second coating is performed by a spray coater, and is then made into real aluminum sheet as aluminum alloy sheet product.

Preferably, the aluminum coil may be an aluminum alloy containing silicon (Si), iron (Fe), copper (Cu) and manganese (Mn) in weight % on the basis of remainder of aluminum (Al). The aluminum alloy may be melted to be made into cast alloy having a constant initial thickness, the cast alloy may be rolled to reduce the initial thickness and may be then heat-treated to be made into aluminum alloy sheet, and the aluminum alloy sheet may be made into the aluminum coil.

The aluminum alloy composition may contain silicon (Si) of 0.5 wt % or less, iron (Fe) of 1.7 to 2.0 wt %, copper (Cu) of 0.5 wt % or less, manganese (Mn) of 2.0 to 6.0 wt %, and remainder of aluminum (Al) and inevitable impurities, and it is preferable that the aluminum alloy sheet made from the composition is heat-treated at a temperature of 300 to 350° C. for 20 to 30 minutes.

The pattern may be formed by rolling the aluminum coil with a pressure of 2500 to 4000 kg/cm$^2$ at a speed of 5 to 10 Hz.

Preferably, the first coating may impart color to a surface of the pattern. The color may be realized by a physical vapor deposition (PVD) coating layer which contains Ti and TiC and is formed on a surface of the aluminum alloy sheet in a PVD chamber under an inert gas atmosphere, a temperature of 70 to 120° C. and a pressure of $3.0 \times 10^{-3}$ to $1.2 \times 10^{-2}$ Torr.

Preferably, the second coating may provide a protective coating on the colored surface of the pattern.

The protective coating is a nano ceramic coating (NCC) which wet-coats a nano ceramic paint including an inorganic binder and ceramic powders.

The wet coating may be performed by any one of gravure coating, microgravure coating, capillary coating and bar coating Preferably, the aluminum alloy sheet product may be formed by cutting the surfacing coil using a press, and may be made into a door trim garnish constituting a door trim.

In addition, in order to achieve the object, a vehicle interior part according to the present disclosure may be characterized in that an aluminum coil made from aluminum alloy containing silicon (Si) of 0.5 wt % or less, iron (Fe) of 1.7 to 2.0 wt %, copper (Cu) of 0.5 wt % or less, manganese (Mn) of 2.0 to 0.5 wt % on the basis of remainder of aluminum (Al) passes sequentially through a rolling mill, a vacuum coater, a spray coater and a press to be formed as a real aluminum sheet having a pattern/color/texture, and the aluminum alloy sheet product is made into a component constituting a door trim.

Preferably, the component may be a door trim garnish.

DESCRIPTION OF EMBODIMENTS

Hereinafter, a structure and operation of the present disclosure will be described in more detail with reference to embodiments of the present disclosure and comparative examples. However, the below description is merely some of the present disclosure, and the present disclosure is not necessarily limited to embodiments described herein.

Therefore, in order to develop the aluminum sheet suitable for the real aluminum, Al—Mn based alloys have been tried. However, elongation is only about 25% even in the case of such an alloy, so that there is a limitation that it is difficult to secure a thin thickness and formability for the real aluminum.

Moreover, even though the aluminum sheet with sufficient requirements for manufacturing the real aluminum is used, an aluminum coil is cut to prepare the aluminum sheet having a desired size and the aluminum sheet should be then transferred to a device for realizing a pattern and color in the manufacturing process. Thus, the yield is very low and high process ratio is inevitably required.

Figure 1:
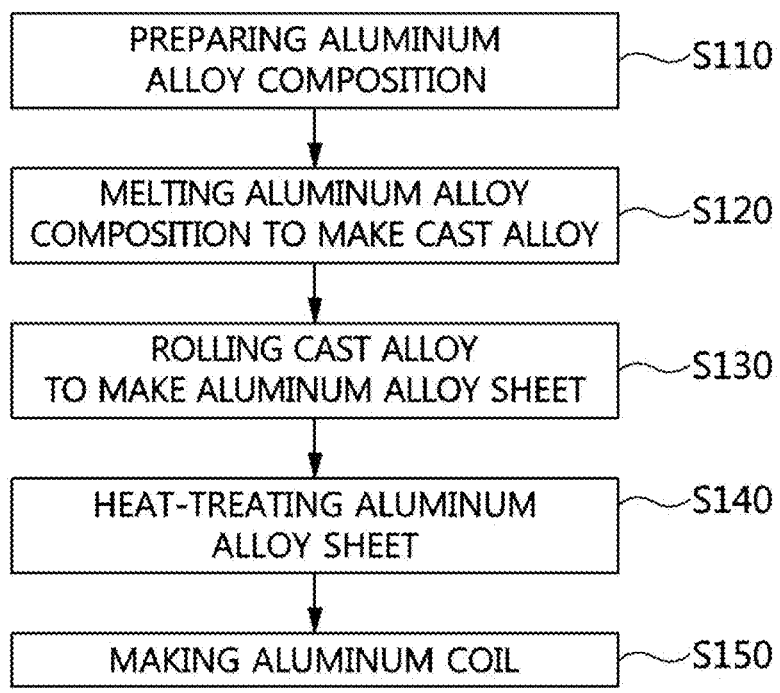
FIG. 1 is a flowchart of a method for manufacturing an aluminum alloy sheet prepared to have a thin-thickness/ formability/a strength suitable for manufacturing a real aluminum of the present disclosure.

FIG. 1 is a flowchart of a method for manufacturing an aluminum alloy sheet of the present disclosure, the present disclosure is characterized by a method for manufacturing an aluminum alloy prepared to have a thin-thickness/formability/a strength suitable for manufacturing a real aluminum which will be descried with reference to FIGS. 10 to 15.

As illustrated in the drawing, the method for manufacturing the aluminum alloy sheet includes a step S110 of preparing aluminum alloy composition, a step S120 of melting the aluminum alloy composition to manufacture cast alloy having a constant initial thickness, a step S130 of rolling the cast alloy to make aluminum alloy sheet having a thickness less than the initial thickness, a step S140 of heat-treating the aluminum alloy sheet, and a step S150 of coiling the aluminum alloy sheet to make an aluminum coil.

The step S110 of preparing the aluminum alloy composition is the step of preparing the aluminum alloy composition in which the content of the composition is optimized to improve a thin-thickness and formability, and it is preferable that this aluminum alloy composition contains silicon (Si) of 0.5 wt % or less, ferrum or iron (Fe) of 1.7 to 2.0 wt %, copper (Cu) of 0.5 wt % or less, manganese (Mn) of 2.0 to 6.0 wt %, and remainder of aluminum (Al) and inevitable impurities.

When the content of silicon (Si) of 0.5 wt % or less is added in the aluminum alloy composition, the strength can be improved and corrosion resistance can be increased in a weak acid atmosphere. In addition, intermetallic compound containing silicon (Si) is also effective for increasing hardness. However, when too much silicon is added, there is a restriction on color implementation of an aluminum alloy sheet. In embodiment, the content of silicon (Si) in the aluminum alloy composition is 0.5 wt % or less.

In the aluminum alloy composition, iron (Fe) has a low equilibrium solidification limit with respect to aluminum and is effective for increasing the strength and surface hardness of the alloy, while suppressing a decrease in electric conductivity. Also, since an elastic modulus of an Al—Fe based alloy is increased by about 2.5% per 1 wt % of iron (Fe), iron is effective for improving the elongation of the aluminum alloy sheet. However, when too much iron is added, intermetallic compound may be formed, thereby lowering corrosion resistance in workability of the aluminum alloy. Therefore, it is preferable to add iron within the above-mentioned range.

In the aluminum alloy composition, it is preferable that copper (Cu) of 0.5 wt % or less is added for promoting solid solution hardening of the aluminum alloy and for easily managing the impurities.

In the aluminum alloy composition, manganese (Mn) is added for securing excellent corrosion resistance of the aluminum alloy sheet. If manganese of 2 wt % to 6 wt % is added, there is the effect that solid solution strengthening occurs or polygonal $Al_6Mn$ intermetallic compound is formed on a surface, surface hardness of the aluminum alloy sheet is thus enhanced by dispersion strengthening.

In the step S120 of melting the aluminum alloy composition to make the cast alloy, in order to manufacture the aluminum alloy sheet, the aluminum alloy composition having the above-described content is melted at a predetermined temperature, the cast alloy is thus manufactured.

Then, the step S130 of manufacturing the aluminum alloy sheet is the step of rolling the cast alloy to a predetermined thickness to produce the aluminum alloy sheet. Here, the cast alloy is rolled to a thickness of 0.4 to 0.8 mm to produce the aluminum alloy sheet. Of course, the thickness of the aluminum alloy sheet is not necessarily limited to the above thickness and may be rolled to have an appropriate thickness.

The step S140 of heat-treating the aluminum alloy sheet is the step of heat-treating the aluminum alloy sheet to a predetermined temperature in order to improve elongation of the aluminum alloy sheet. The produced aluminum alloy sheet may be heat-treated at a temperature of 300 to 350° C. for 20 to 30 minutes, and more preferably, may be heat-treated at a temperature of 330° C. for 20 minutes.

The below Table 1 represents compositional contents of examples of aluminum alloys and compositional content of the aluminum alloy of the present disclosure. Comparative Examples in Table 1 show the aluminum alloys of A8014 (Comparative Example 1) and A8150 (Comparative Example 2) as the 8000-based aluminum alloy.

TABLE 1

| Classification | Si | Fe | Cu | Mn | Mg | Zn | Ti | Al |
|---|---|---|---|---|---|---|---|---|
| Comparative Example 1 (A8014) | 0.3 | 1.2-1.6 | 0.2 | 0.2-0.6 | 0.10 | 0.10 | 0.10 | Remainder |
| Comparative Example 2 | 0.20 | 1.2-1.7 | 0.05 | — | — | — | — | Remainder |

TABLE 1-continued

| Classification | Si | Fe | Cu | Mn | Mg | Zn | Ti | Al |
|---|---|---|---|---|---|---|---|---|
| (A8150) Example | ~5.0 | 1.7-2.0 | ~5.0 | 2.0-5.0 | — | — | — | Remainder |

Mechanical properties, such as yield strength, ultimate tensile strength, elongation and ultimate elongation (F-max), of the aluminum alloy sheet before heat treatment, which had the composition of the content of manganese (Mn) in the aluminum alloy composition according to the present disclosure, were measured at a speed of 50 mm/min. according to criteria of ASTM D638, which is the standard measuring method. In order to verify the reproducibility of the data, the results derived from five tests were reviewed, and the results are shown in Tables 2 and Table 3 below.

TABLE 2

| Material | Classification | Orientation | Yield strength (MPa) | Ultimate tensile strength (MPa) | Elongation (%) | F-max El. (%) | n-value |
|---|---|---|---|---|---|---|---|
| Mn 2.0 wt % | 1 | 0° | 56.81 | 102.22 | 22.21 | 43.12 | 0.186 |
| | 2 | 0° | 57.00 | 102.51 | 21.34 | 40.08 | 0.191 |
| | 3 | 0° | 57.19 | 102.27 | 22.40 | 43.02 | 0.191 |
| | 4 | 0° | 56.81 | 102.17 | 2.68 | 39.44 | 0.190 |
| | 5 | 0° | — | — | — | — | — |
| | Average | | 56.95 | 102.29 | 22.16 | 41.42 | 0.190 |
| | 1 | 90° | 49.18 | 93.11 | 25.40 | 35.88 | 0.197 |
| | 2 | 90° | 48.51 | 93.33 | 24.28 | 29.48 | 0.194 |
| | 3 | 90° | 47.44 | 93.28 | 24.93 | 31.28 | 0.197 |
| | 4 | 90° | 47.37 | 93.26 | 25.20 | 37.30 | 0.195 |
| | 5 | 90° | 48.42 | 93.18 | 24.86 | 29.70 | 0.196 |
| | Average | | 48.18 | 93.23 | 24.93 | 32.73 | 0.196 |

TABLE 3

| Material | Classification | Orientation | Yield strength (MPa) | Ultimate tensile strength (MPa) | Elongation (%) | F-max El. (%) | n-value |
|---|---|---|---|---|---|---|---|
| Mn 6.0 wt % | 1 | 0° | 42.61 | 84.57 | 26.11 | 47.89 | 0.212 |
| | 2 | 0° | 42.95 | 86.25 | 28.76 | 47.70 | 0.220 |
| | 3 | 0° | 42.79 | 86.21 | 28.97 | 49.48 | 0.214 |
| | 4 | 0° | 42.7 | 86.16 | 26.16 | 47.54 | 0.211 |
| | 5 | 0° | 42.66 | 86.18 | 27.81 | 46.61 | 0.212 |
| | Average | | 42.74 | 85.87 | 27.56 | 47.84 | 0.214 |
| | 1 | 90° | 42.67 | 84.06 | 27.67 | 46.24 | 0.211 |
| | 2 | 90° | 42.40 | 84.00 | 26.00 | 47.45 | 0.207 |
| | 3 | 90° | 42.64 | 82.59 | 28.70 | 48.26 | 0.202 |
| | 4 | 90° | 42.66 | 82.53 | 29.67 | 48.24 | 0.205 |
| | 5 | 90° | 42.47 | 83.95 | 26.59 | 45.92 | 0.211 |
| | Average | | 42.57 | 83.43 | 27.73 | 47.22 | 0.207 |

After heat-treating the aluminum alloy sheet in which the content of manganese (Mn) was adjusted to 6 wt %, ultimate tensile strength and elongation as the mechanical properties were measured. The results of measurement are shown in Table 4 below. Here, "n-value" shown in Table is a measurement value of a response of metal to cold working, and is usually referred to as the strain hardening exponent.

TABLE 4

| Classification | Ultimate tensile strength (MPa) | Elongation (%) |
| --- | --- | --- |
| 1 | 93.22 | 40.896 |
| 2 | 93.82 | 49.49 |
| 3 | 95.15 | 46.433 |
| 4 | 79.93 | 45.229 |
| 5 | 93 | 47.274 |
| Average | 91 | 45.9 |

As shown in Table 4, it could be confirmed that ultimate tensile strength and elongation of the aluminum alloy sheet after heat treatment were improved compared with those before heat treatment.

Figure 2:
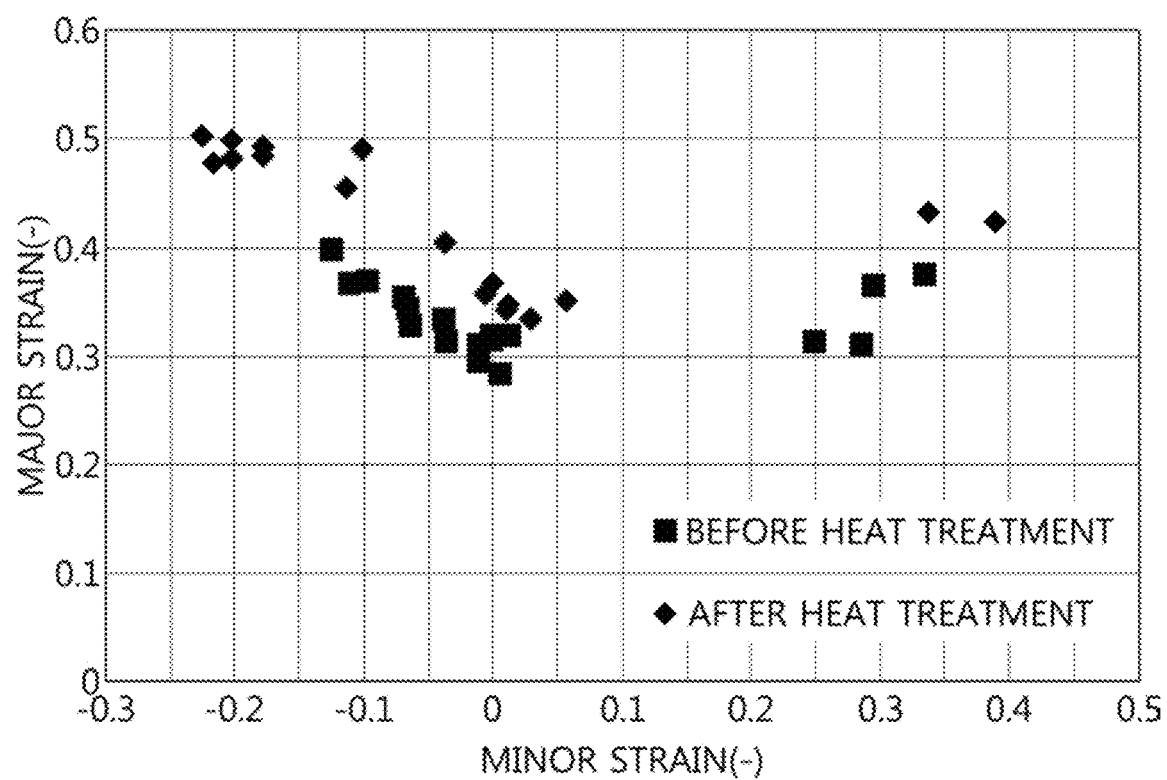
FIG. 2 is a graph showing the results of a forming limit diagram (FLD) test of an aluminum alloy sheet before and after heat treatment for the aluminum alloy sheet of the present disclosure.

In addition, as a result of confirming formability of the aluminum alloy sheet, in which the content of manganese (Mn) was adjusted to 6 wt %, after and before heat treatment with the forming limit diagram (FLD) test as shown in FIG. 2, it was confirmed that formability of the aluminum alloy sheet before the heat treatment was similar to that of the aluminum alloy sheet after the heat treatment. Accordingly, from these results, it could be seen that, through heat treatment, the mechanical properties such as yield strength and elongation of the aluminum were improved, whereas formability was maintained.

In addition, FIGS. 3A, 3B, 3C, and 3D is photographs showing formability of the aluminum alloy sheet according to the content of manganese (Mn).

Figure 3A:
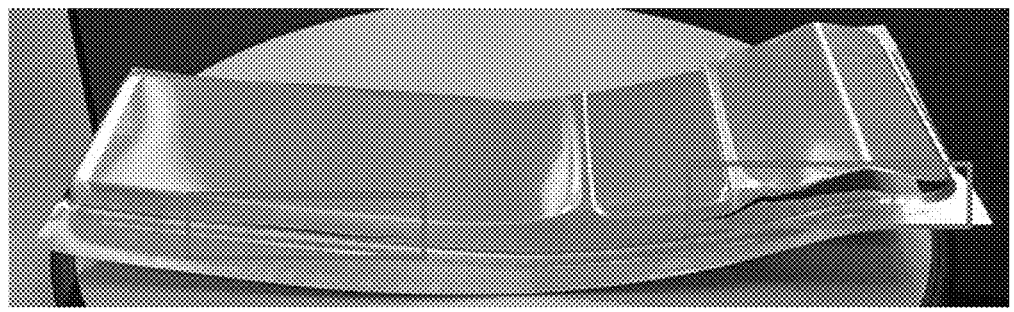
FIGS. 3A, 3B, 3C, and 3D are photographs showing formability of the aluminum alloy sheet according to the present disclosure according to the content of manganese (Mn).
Figure 3B:
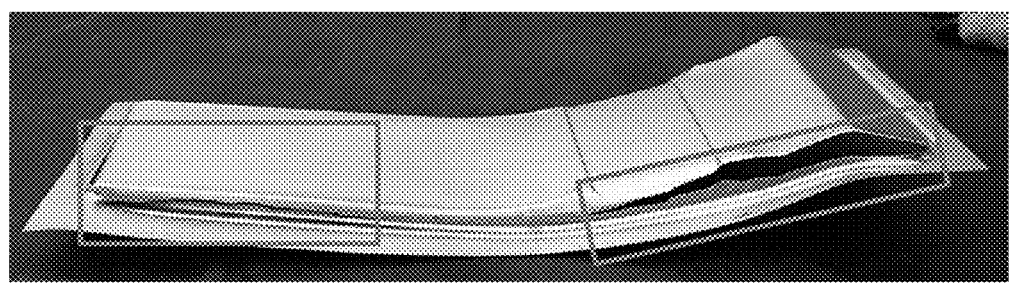
Figure 3C:
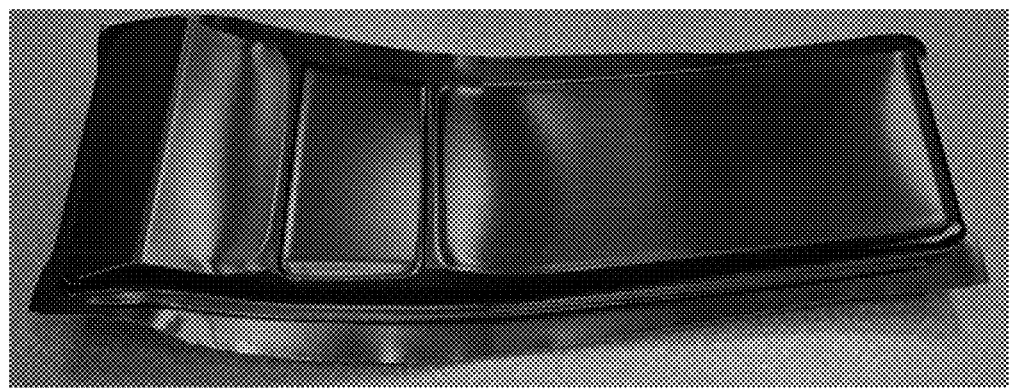
Figure 3D:
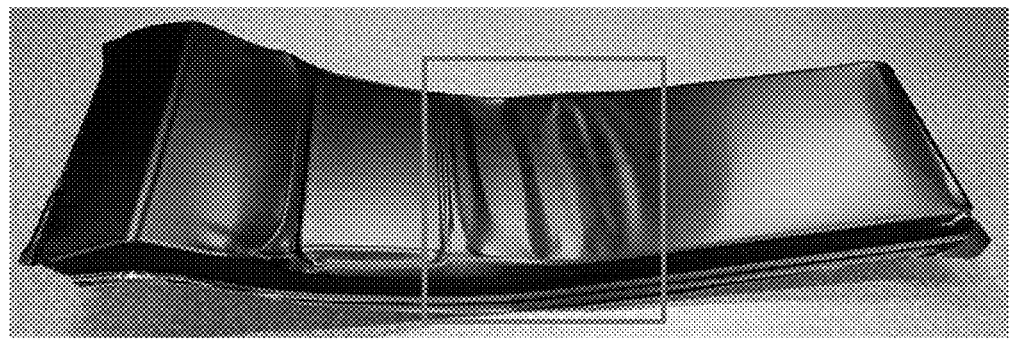

FIG. 3A shows the result of press-forming the aluminum alloy sheet in which the content of manganese (Mn) is 0.5 wt %, into a certain shape, FIG. 3B shows the result of press-forming the aluminum alloy sheet in which the content of manganese (Mn) is 1.5 wt %, into a certain shape, FIG. 3C shows the result of press-forming the aluminum alloy sheet in which the content of manganese (Mn) is 2.5 wt %, into a certain shape, and FIG. 3D shows the result of press-forming the aluminum alloy sheet in which the content of manganese (Mn) is 6.5 wt %, into a certain shape.

From the above results, it could be confirmed that, except only the case in which the content of manganese (Mn) was 2.5 wt % as shown in FIG. 3C, a damaged portion or wrinkling may be occurred in the remaining cases of FIGS. 3A, 3B, and 3D.

Figure 4A:
FIGS. 4A and 4B are photographs showings surfaces of A8150 aluminum alloy sheet and the aluminum alloy sheet according to one embodiment of the present disclosure after performing rolling and hard-facing treatment, respectively.
Figure 4B:
Figure 5A:
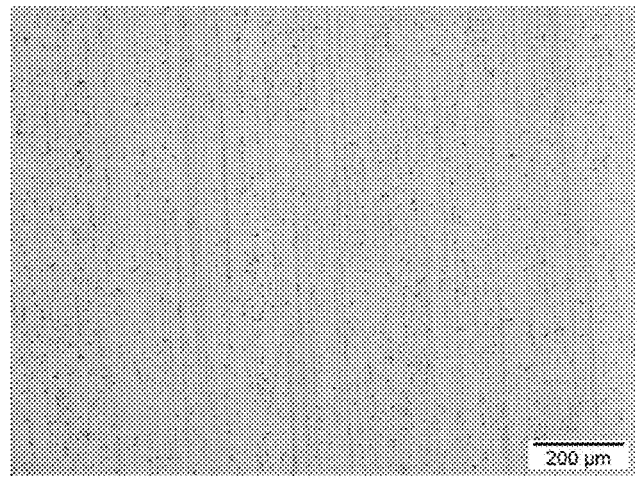
FIGS. 5A and 5B are photographs, taken by an optical microscope, showing the surfaces of the A8150 aluminum alloy sheet and the aluminum alloy sheet according to one embodiment of the present disclosure after performing the rolling and hard-facing treatment, respectively.
Figure 5B:
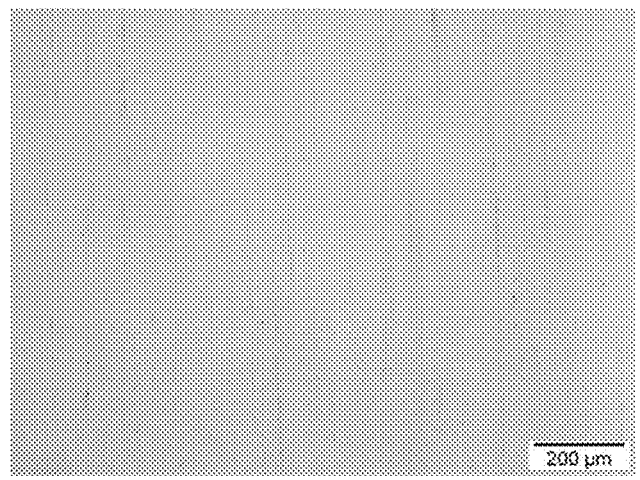

FIGS. 4A, 4B, 5A, and 5B are comparative diagrams and photographs showings surfaces of A8150 aluminum alloy sheet and the aluminum alloy according to one embodiment of the present disclosure, respectively, after performing the rolling and hard-facing treatment. In this case, FIGS. 4A and 5A show A8150 aluminum alloy sheet, and FIGS. 4B and 5B show the aluminum alloy sheet according to the present disclosure.

As shown in FIG. 4A and FIG. 5A, average surface roughness (Ra) of the A8150 aluminum alloy sheet was 0.07 μm, and it could be confirmed that, as the surface hardness was lowered, marks of a rolling roll were generated after performing the rolling and hard-facing treatment. On the other hand, as shown in FIG. 4B and FIG. 5B, as a result, unlike the A8150 aluminum alloy sheet, the aluminum alloy sheet of the present disclosure had average surface roughness Ra of 0.02 μm and the surface hardness was improved by addition of iron (Fe), so that it was confirmed that surface quality was good even after performing the same rolling and hard-facing treatment.

FIGS. 6A, 6B, 6C, 7A, and 7B are comparative diagrams and photographs showings microstructures of surfaces of the aluminum alloy sheets of A8014 (FIG. 6A), A3055 (FIG. 6B) and A8150 (FIG. 6C) and of a surface of the aluminum alloy sheet (FIGS. 7A and 7B) according to one embodiment of the present disclosure.

Figure 6A:
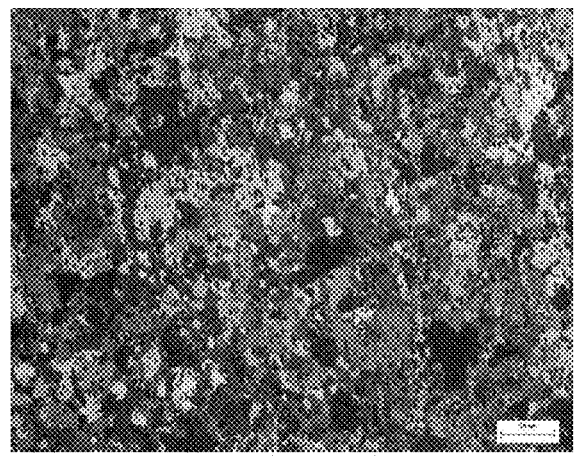
FIGS. 6A, 6B, and 6C are enlarged photographs of microstructure of A8014 aluminum alloy sheet, A3055 aluminum alloy sheet, and A8150 alloy sheet, respectively.
Figure 6B:
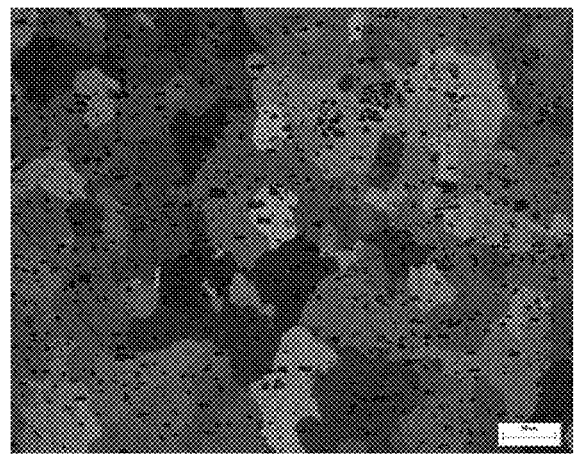
Figure 6C:
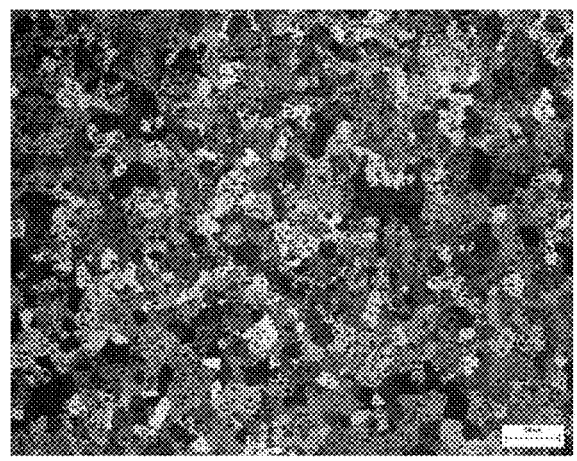
Figure 7A:
FIGS. 7A and 7B are enlarged photographs of a microstructure of the aluminum alloy sheet manufactured according to one embodiment of the present disclosure.
Figure 7B:
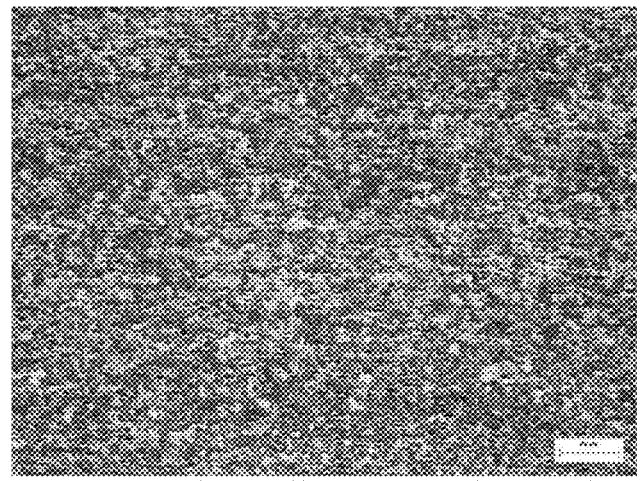

It was confirmed that, as compared with the aluminum alloy sheets of A8014, A3055 and A8150 as shown in FIGS. 6A, 6B, and 6C, a size of crystal grain of the aluminum alloy sheet of the present disclosure shown in FIGS. 7A and 7B was very small and smaller than that of the aluminum alloy sheets of A8014, A3055 and A8150. In this case, FIGS. 7A and 7B represent a plane surface and a side face of the aluminum alloy sheet, respectively.

Figure 8:
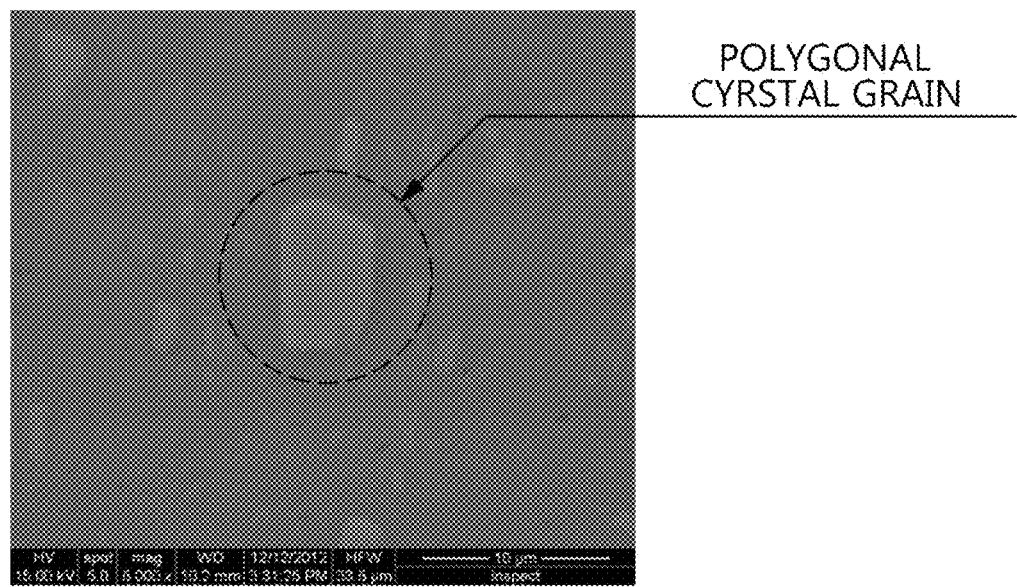
FIGS. 8 and 9 are photographs showing the results of detection experiment using the energy dispersive spectroscopy (EDS) for the aluminum alloy sheet according to one embodiment of the present disclosure.
Figure 9:
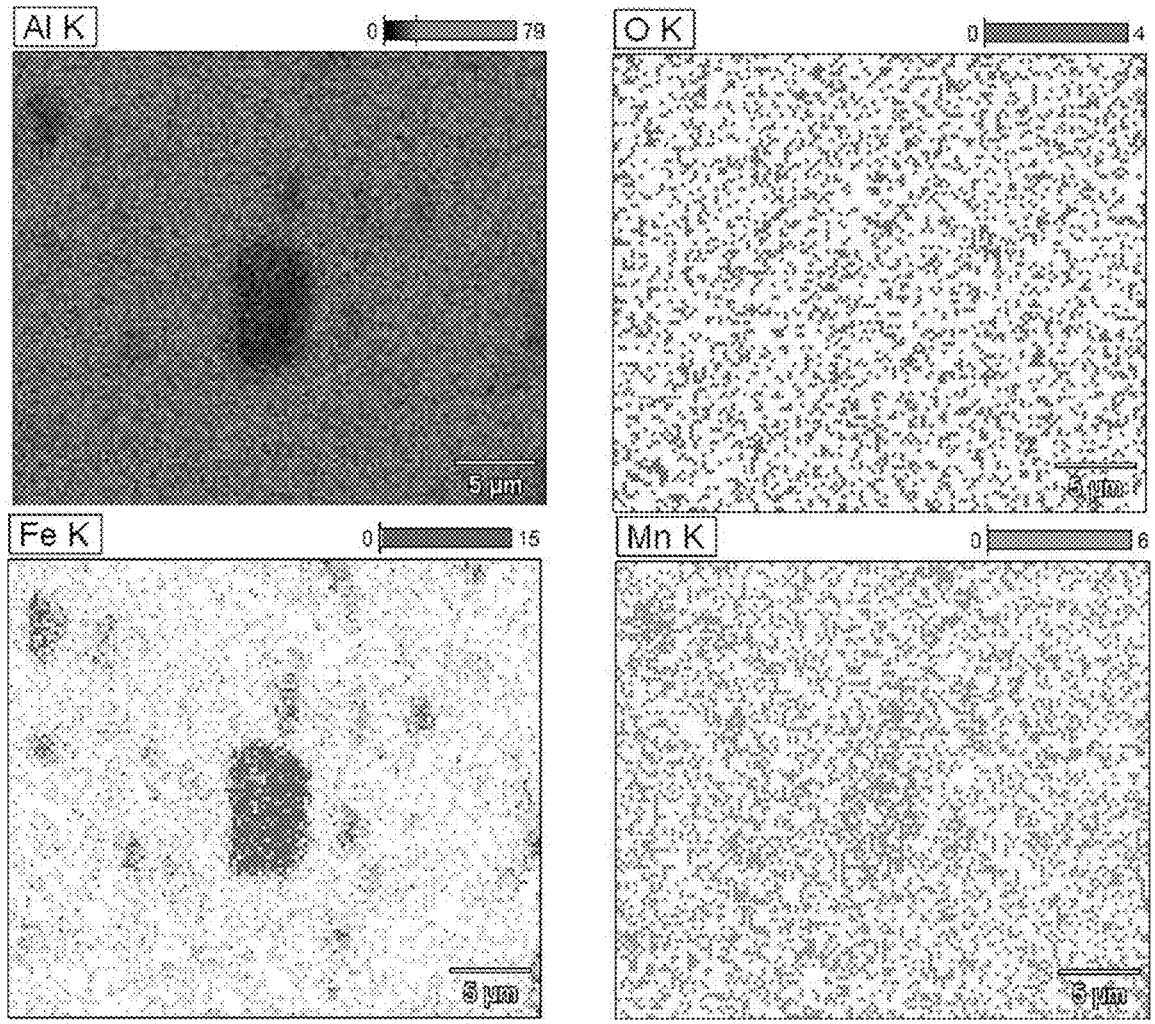

FIGS. 8 and 9 are photographs showing the results of detection of energy dispersion for the aluminum alloy sheet according to one embodiment of the present disclosure.

As shown in the drawings, it can be confirmed that polygonal Al—Fe—Mn intermetallic compounds with a micro size of several μm are uniformly distributed in the aluminum alloy sheet of the present disclosure.

Here, the results of detection of energy dispersion are obtained by the energy dispersive spectroscopy (EDS). In the energy dispersive spectroscopy, an electron beam generated from an electron gun of an electron microscope are scanned on a surface of specimen, and various signals are generated by interaction between an electron and an atom of the specimen, and at this time, an x-ray signal, that analyzes chemical components, of various signals generated as above is detected by an energy or wavelength detector to analyze the chemical components contained in the specimen.

As shown in Table 5, the aluminum alloy sheet of the present disclosure proves an example in which the surface quality is improved when the rolling and hard-facing treatment is performed, due to the effect of uniformly distributed fine crystal grains which cause the improved surface hardness.

TABLE 5

| Classification | Weight % | Atomic % |
| --- | --- | --- |
| Al | 50.92 | 67.07 |
| Si | 0.46 | 0.58 |
| Mn | 2.44 | 1.58 |
| Fe | 45.32 | 28.84 |
| O | 0.87 | 1.93 |
| Total | 100.00 | 100.00 |

In particular, Table 5 specifically shows component of Al—Fe—Mn intermetallic compound of the present disclosure to which iron is added, in which a roll mark occurring phenomenon on a material of 8000 series after performing the rolling and hard-facing treatment can be minimized or avoided. The surface hardness of the material of 8000 series is lowered, through the polygonal crystal grains which have a size of several μm and are uniformly distributed as shown in FIG. 8 to cause an enhancement of the surface hardness.

On the other hand, FIGS. 10 to 16 illustrate a series of continuous processes in which the aluminum coil is made from the aluminum alloy sheet, as previously described, of the present disclosure in the step 150 in FIG. 1, the real aluminum sheet having excellent internal structure is manufactured by directly using the aluminum coil in a coil-to-uncoil process, and a real aluminum sheet is then made and formed into a vehicle interior part such as a door trim garnish.

Figure 10:
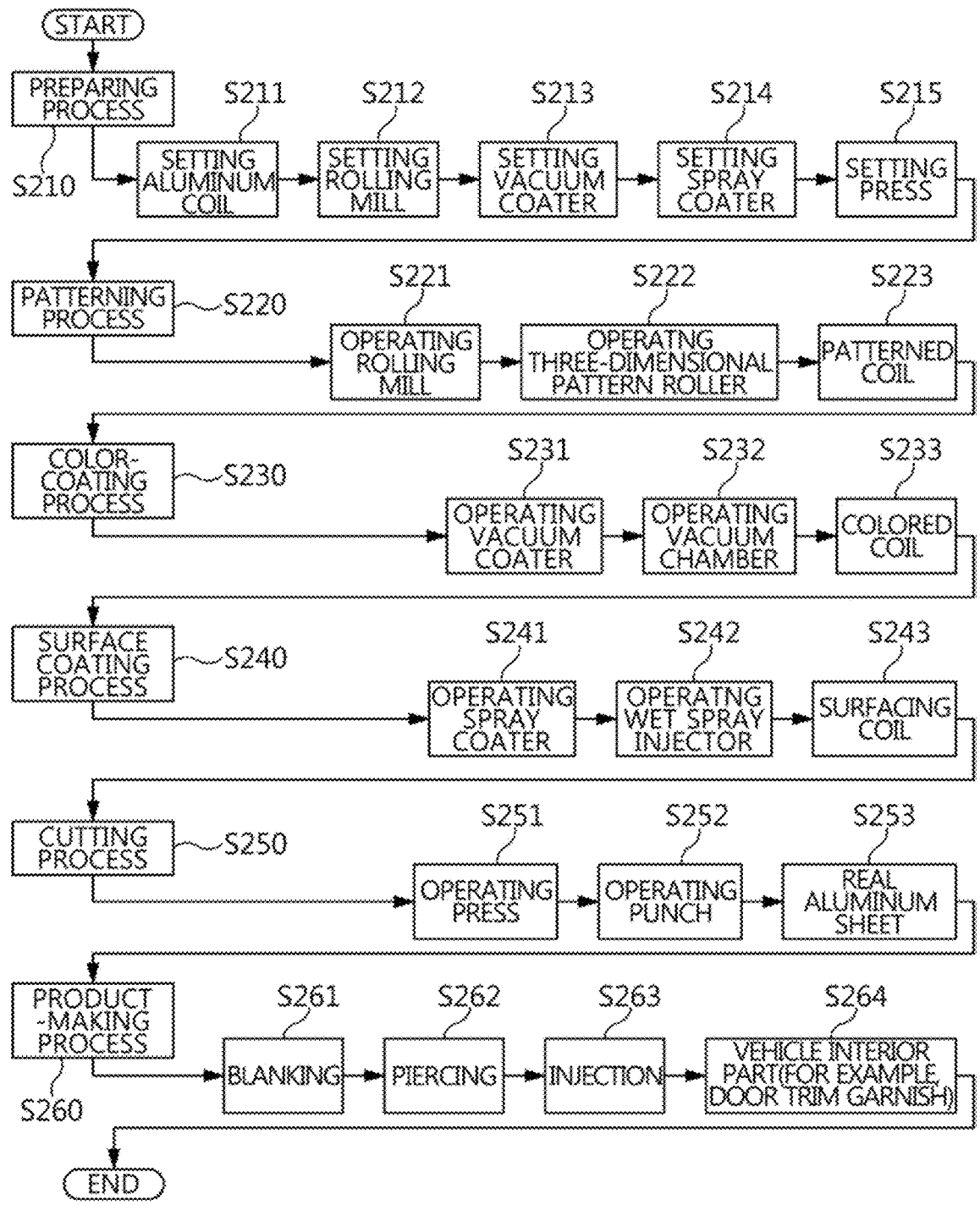
FIG. 10 is a flow chart of a method for manufacturing a real aluminum using an aluminum coil of the aluminum alloy sheet, which can be applied to a coil-to-uncoil process, of the present disclosure.

Referring to FIG. 10, a method for manufacturing the aluminum alloy sheet product using the aluminum alloy sheet which can be applied to the coil-to-uncoil process includes a preparing process of S210, a patterning process of S220, a color-coating process of S230, a surface coating process S240, a cutting process of S250 and a product-making process of S2620.

Figure 11:
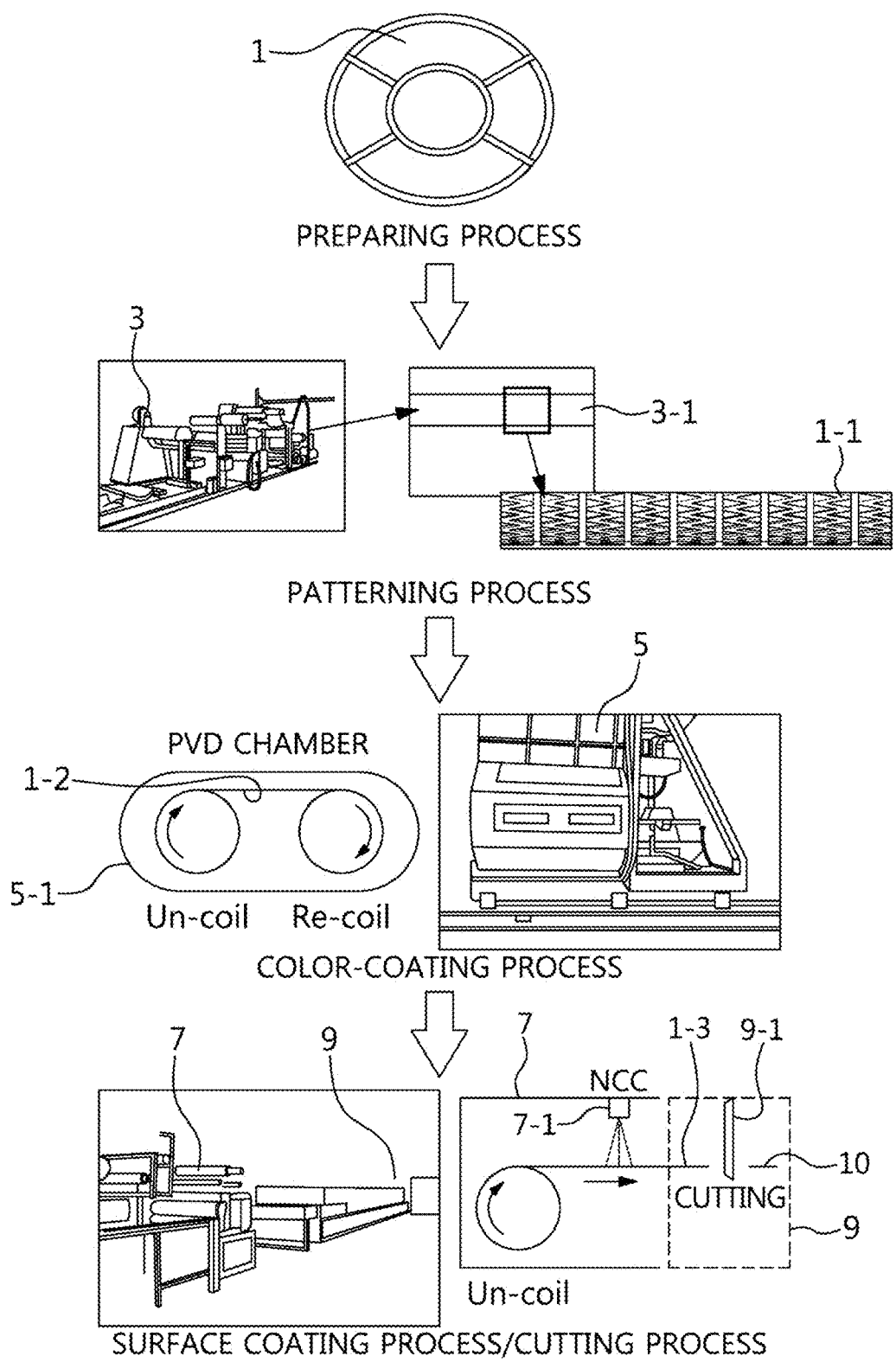
FIG. 11 shows one example of a process in which a real aluminum sheet is made from the aluminum coil of the present disclosure by the coil-to-uncoil process.

Specifically, the preparing process S210, the patterning process S220, the color-coating process S230, the surface coating process S240, the cutting process S250 and the product-making process S260 are described with reference to FIG. 11 as below.

As one example, the preparing step S210 is performed by setting the aluminum coil as in S211, setting a rolling mill as in S212, setting a vacuum coater as in S213, setting a spray coater as in S214, and setting a press as in S15. Therefore, the preparing process S210 means that the aluminum coil 1 as raw material used for manufacturing the real aluminum is prepared, and a rolling mill 3 performing the coil-to-uncoil process, a vacuum coater 5, a spray coater 7 and a press 9 are ready for driving. Particularly, devices for blanking/piercing/injection to be used in the product-making process S260 may also be set in the preparing process S210.

In this case, the aluminum coil 1 is the aluminum alloy sheet which is manufactured by the method for manufacturing the aluminum alloy sheet shown in FIG. 1, contains silicon (Si) of 0.5 wt % or less, iron (Fe) of 1.7 to 2.0 wt %, copper (Cu) of 0.5 wt % or less, manganese (Mn) of 2.0 to 5.0 wt % and remainder of aluminum (Al) and inevitable impurities, is heat-treated and has a coil shape to be capable of continuously supplied to rolling mill.

As one example, in the patterning step S220, the rolling mill 3 to which the aluminum coil 1 is connected is operated as in S221 and as in S222, a three-dimensional pattern roller 3-1 is operated to allow a three-dimensional design (or shape) of the roller is formed on the aluminum coil 1 while the aluminum coil passes though the rolling mill 3. Particularly, the three-dimensional pattern roller 3-1 rolls the aluminum coil with a pressure of 2500 to 4000 kg/cm$^2$ at a speed of 5 to 10 Hz to form a three-dimensional pattern.

Further, various kinds of three-dimensional pattern designs (or shapes) may be applied by changing the kind of three-dimensional pattern roller 3-1, if necessary.

As a result, in the patterning step S220, the aluminum coil 1 passing through the rolling mill 3 is transformed into a patterned coil 1-1 having a three-dimensional pattern is made from as in S223.

Figure 12A:
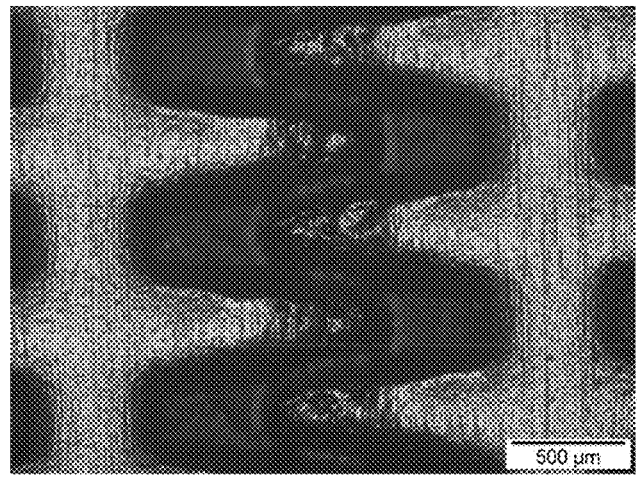
FIGS. 12A and 12B is photographs, one of which, taken by an optical microscope, showing a surface of a patterned coil formed by rolling the aluminum coil according to one embodiment of the present disclosure, and the other showing the result of measuring surface roughness thereof
Figure 12B:
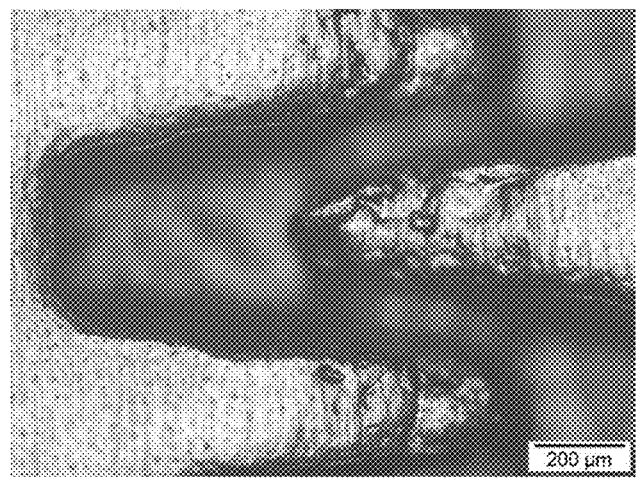

FIGS. 12A and 12B illustrates the patterned coil 1-1 having a three-dimensional pattern formed by rolling the aluminum coil 1 having a thickness of 0.6 mm at a rolling speed of 8 Hz and a pressure of 3,500 kg/cm$^2$.

As one example, in the color-coating process S230, the vacuum coater 5 to which the patterned coil 1-1 exiting the rolling mill 3 is connected is operated as in S231, and a vacuum chamber 5-1 is operated to form a PVD coating layer and impart the color on a surface of the patterned coil 1-1 during coiling/uncoiling process in which the patterned coil 1-1 is coiled and uncoiled by a pair of roller in the vacuum chamber 5-1 as in S232.

In this case, the vacuum chamber 5-1 is a PVD chamber for forming the PVD (physical vapor deposition) coating layer on the surface of the patterned coil 1-1 to impart the color, and in the PVD chamber under an inert gas atmosphere, the PVD coating layer containing Ti and TiC is formed on the surface of the patterned coil 1-1 under the conditions of a temperature of 70 to 120° C. and a pressure of $3.0 \times 10^{-3}$ to $1.2 \times 10^{-2}$ Torr, so that the color is realized on a surface of the patterned coil.

As a result, in the color-coating process S230, the patterned coil 1-1 is transformed into a colored coil 1-2, as in S233, through a first coating process. In this case, a process in which the aluminum coil 1 passes through the three-dimensional pattern roller 3-1 of the rolling mill 3 and is transformed into the patterned coil 1-1 is continued.

Figure 13:
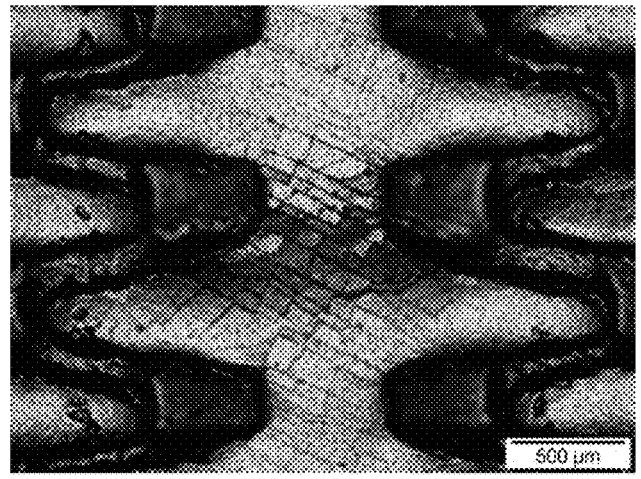
FIG. 13 is a photograph showing an edge portion observed when an aluminum sheet is coated and formed by an anodizing method.

FIG. 13 shows an example in which an electrochemical film forming method called the anodizing for improving a texture of metal, and shows that when the aluminum alloy sheet to which this anodizing method is applied is formed to have a desired shape in a subsequent process, a crack of an anodizing layer is generated in an edge portion of the pattern.

Figure 14:
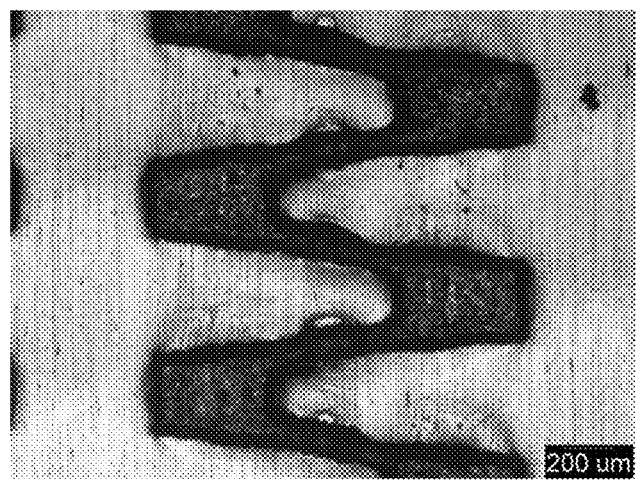
FIG. 14 is a photograph showing an edge portion observed when the aluminum coil is formed by an aluminum coil forming method disclosed in the present disclosure.

On the other hand, FIG. 14 shows the PVD coating layer on which the color is imparted by the PVD method as in the present disclosure, and shows that no crack is generated in the PVD coating layer even after forming the flexible metal coating layer with the press.

As one example, in the surface coating process S240, the spray coater 7 to which the colored coil 1-2 exiting the vacuum coater 5 is connected is operated as in S241, and a wet spray injector 7-1 is operated as in S242 to form a nano ceramic coating (NCC) layer on a surface of the colored coil 1-2 during an uncoiling process in which the colored coil is uncoiled by the roller.

In this case, the spray coater 7 employs an NCC method and coats a nano ceramic paint, including an inorganic binder and ceramic powders, on the surface of the colored coil 1-2, which is colored with the PVD coating layer, by a wet coating method to form a protective coating layer. Any one selected from a gravure coating, a microgravure coating, a capillary coating and a bar coating may be used as the above wet coating method, and the present disclosure is not necessarily limited thereto.

As a result, in the surface coating step S240, the colored coil 1-2 is transformed into a surfacing coil 1-3 by a second coating process as in S243. In this case, the process in which the aluminum coil 1 is transformed into the patterned coil 1-1 while passing through the three-dimensional pattern roller 3-1 of the rolling mill 3, and the patterned coil is transformed into the colored coil 1-2 while passing through the vacuum chamber 5-1 of the vacuum coater 5 is continued.

As one example, in the cutting process S250, the press 9 through which the surface coil 1-3 exiting the spray coater 7 passes is operated as in S251, and a punch 9-1 is operated as in S252 to cut the surfacing coil 1-3 to have a predetermined sheet size.

As a result, in the cutting step S250, a real aluminum sheet 10 is made from the surfacing coil 1-3 as in 253. In this case, the process in which the aluminum coil 1 is transformed into the patterned coil 1-1 while passing through the three-dimensional pattern roller 3-1 of the rolling mill 3, the patterned coil is transformed into the colored coil 1-2 while passing through the vacuum chamber 5-1 of the vacuum coater 5, and the colored coil is transformed into the surfacing coil 1-3 while passing through the wet spray injector 7-1 of the spray coater 7 is continued.

Figure 15A:
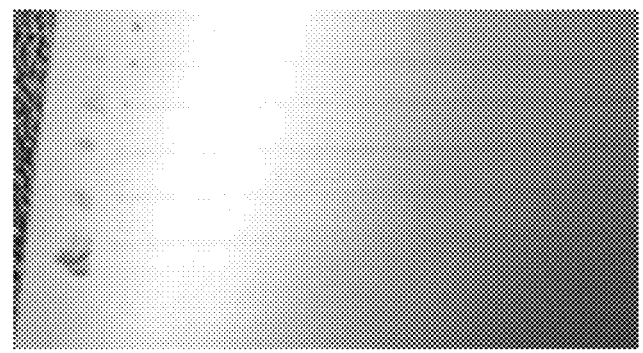
FIGS. 15A and 15B shows the results of confirming scratch-resistance of an aluminum sheet having an anodizing layer formed thereon by a anodizing method and the real aluminum sheet having a PVD coating layer and a protective coating layer formed thereon by the aluminum coil forming method disclosed in the present disclosure.
Figure 15B:

FIGS. 15A and 15B shows the results of scratch-resistance test for the real aluminum sheet 10.

FIG. 15A shows that a noticeable scratch mark is formed on the anodizing layer of the aluminum sheet, whereas FIG. 15B shows that a light mark that is formed on the PVD coating layer and the protective coating layer of the real aluminum sheet 10.

In this case, the scratch resistance test may be performed by scraping the surface of the sheet with a scratch-resistant scratcher having a pointed tip.

As one example, in the product-making process S260, a blanking of S261, a piercing of S262, and an injection of S263 are applied to the real aluminum sheet 10, so that a vehicle internal part is made from the real aluminum sheet 10 as in S264.

Figure 16:
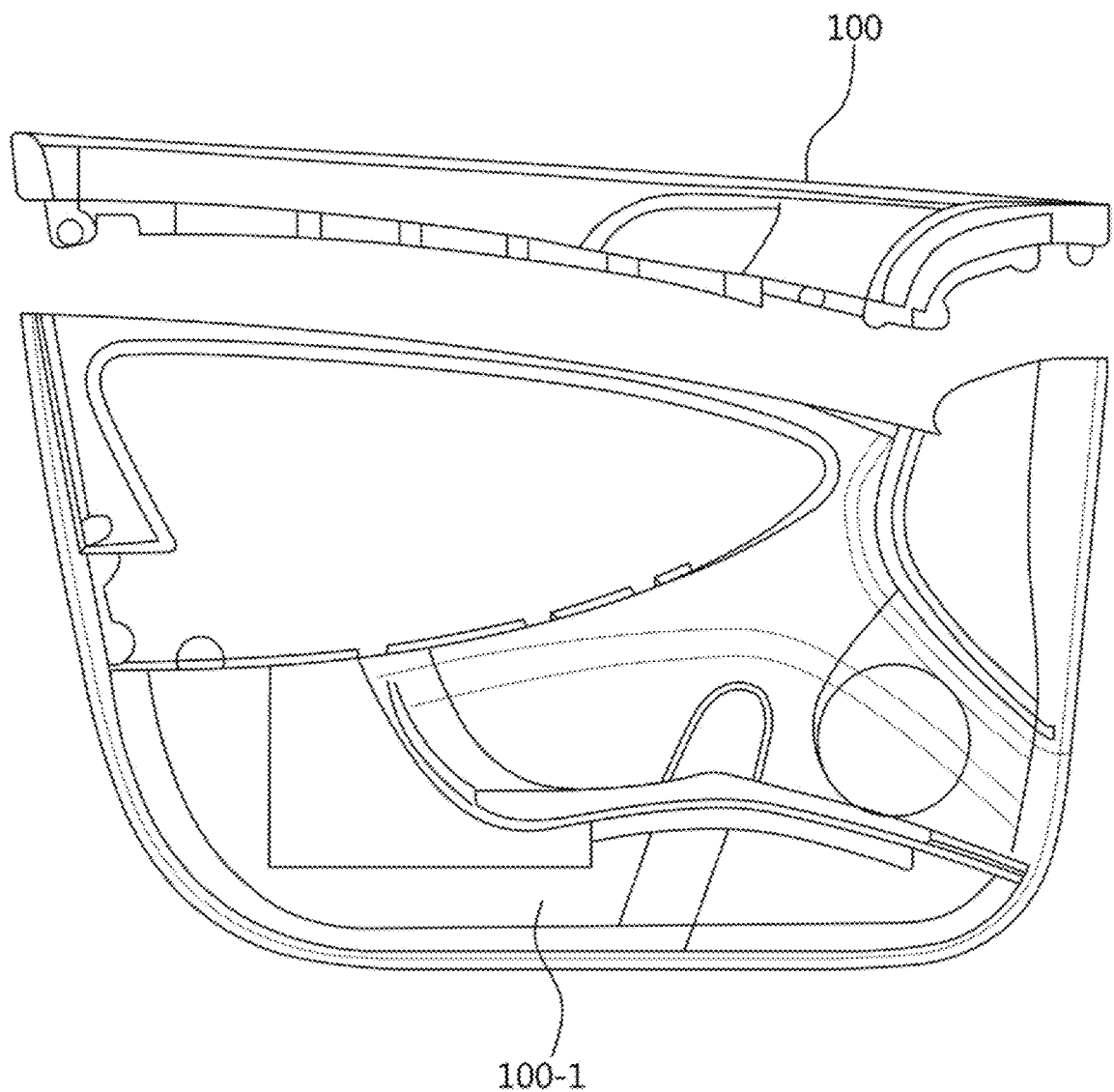
FIG. 16 shows an example of a vehicle interior part obtained by manufacturing the real aluminum sheet from the aluminum coil of the aluminum alloy sheet of the present disclosure using the coil-to-uncoil process, and then forming the aluminum alloy sheet product.

FIG. 16 shows an example in which a door trim garnish 100 applied to a door trim 100-1 constituting a door is made from the real aluminum sheet 10.

As described above, the aluminum coil 1 of the aluminum alloy sheet according to the present disclosure can improve the surface hardness of the sheet even after rolling to manufacture the real aluminum sheet having high quality and high formability. In addition, the method of manufacturing the real aluminum sheet disclosed in the present disclosure has the effect that since a pattern production, color implementation and a surface process are performed in a continuous process by the coil-to-uncoil method using the shape of the aluminum coil 1, it is possible to form the real aluminum sheet 10 more easily and quickly than other surface treatment methods such as a screen printing or an anodizing, and physical properties such as the gloss degree, scratch resistance, and the like are excellent.

The real aluminum sheet 10 provided in the present disclosure and having the above characteristics can be widely applied to various fields such as the sheet for vehicle interior part, the exterior sheet, the packaging material, and the like.

In the real aluminum manufacturing method of the present disclosure, since the real aluminum is manufactured by using the aluminum coil of the aluminum alloy sheet having a thin-thickness, formability and a strength and is then cut to have a sheet size, It is possible to batch the coil-to-uncoil process which can achieve high yield and cost reduction. Especially, physical properties of the aluminum alloy sheet suitable for the real aluminum are realized by optimization of the contents of silicon (Si), iron (Fe), copper (Cu) and manganese (Mn) and heat treatment, so that it is possible to overcome limitation of technical difficulties.

In addition, the aluminum alloy sheet manufactured according to the method for manufacturing the aluminum alloy sheet, which has improved formability, for a vehicle interior part according to the present disclosure has an effect that deepness and surface roughness are enhanced by 30 times or more due to a step difference in pattern as compared with the A8150 aluminum material.

In addition, the method of forming the aluminum alloy sheet of the present disclosure is suitable for realizing a metal texture in terms of light resistance and scratch resistance as compared with the anodizing method, and since a crack does not occur in the edge portion during press forming, there is an improved effect as compared with the existing forming process.

Although the present disclosure has been described with a focus on novel features of the present disclosure applied to various embodiments, it will be apparent to those skilled in the art that various deletions, substitutions, and changes in the form and details of the apparatus and method described above may be made without departing from the scope of the present disclosure. Accordingly, the scope of the present disclosure is defined by the appended claims rather than by the foregoing description. All modifications within the equivalent scope of the appended claims are embraced within the scope of the present disclosure.

What is claimed is:

1. A method for manufacturing of an aluminum alloy sheet product, the method comprising:
    patterning a surface of an aluminum alloy sheet with rolls such that the aluminum alloy sheet has a pattern on a surface thereof;
    performing color coating over the patterned surface having the pattern by using a vacuum coater to form a color coating layer over the patterned surface; and
    performing protective coating over the color coating layer by using a spray coater to form a protective coating layer over the color coating layer,
    wherein the aluminum alloy sheet comprises an aluminum alloy containing silicon (Si) of 0.5 wt % or less, iron (Fe) of 1.7 to 2.0 wt %, copper (Cu) of 0.5 wt % or less, and manganese (Mn) of 2.0 to 6.0 wt %, and the remainder aluminum (Al).

2. The method of claim 1, further comprising, prior to patterning, providing a melt aluminum alloy composition containing silicon (Si), iron (Fe), copper (Cu) and manganese (Mn) in weight % on the basis of remainder of aluminum (Al), casting the melt aluminum alloy composition into a cast alloy having an initial thickness, rolling the cast alloy to reduce the initial thickness and performing heat-treatment to make the aluminum alloy sheet, and winding the aluminum alloy sheet into a coil.

3. The method of claim 2, wherein the heat-treatment is performed at a temperature of 300° C. to 350° C. for 20 minutes to 30 minutes.

4. The method of claim 1, wherein the pattern is formed by rolling the aluminum alloy sheet with a pressure of 2500 kg/cm$^2$ to 4000 kg/cm$^2$ at a speed of 5 Hz to 10 Hz.

5. The method of claim 1, further comprising, prior to patterning, uncoiling a coil of the aluminum alloy sheet.

6. The method of claim 1, wherein the color coating layer comprises a physical vapor deposition (PVD) coating layer which contains Ti and TiC and is formed on the patterned surface of the aluminum alloy sheet in a PVD chamber under an inert gas atmosphere, a temperature of 70° C. to 120° C. and a pressure of $3.0 \times 10^{-3}$ Torr to $1.2 \times 10^{-2}$ Torr.

7. The method of claim 1, wherein the protective coating provides the protective coating layer of a non-metallic material on the color coating layer.

8. The method of claim 7, wherein the protective coating comprises a nano ceramic coating (NCC) which wet-coats nano ceramic paint including an inorganic binder and ceramic powders.

9. The method of claim 1, further comprising cutting the aluminum alloy sheet having the pattern, the color coating layer, and the protective coating layer.

10. The method of claim 9, further comprising metal-working the cut aluminum alloy sheet to make a door trim garnish.

* * * * *